United States Patent
Robison et al.

(10) Patent No.: US 11,361,819 B2
(45) Date of Patent: Jun. 14, 2022

(54) STAGED BITLINE PRECHARGE (71) Applicant: ADVANCED MICRO DEVICES, INC., Santa Clara, CA (US)

(72) Inventors: Andrew Robison, Fort Collins, CO (US); Michael K. Ciraula, Fort Collins, CO (US); Eric Busta, Fort Collins, CO (US); Carson Donahue Henrion, Fort Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/841,649

(22) Filed: Dec. 14, 2017

(65) Prior Publication Data
US 2019/0189196 A1 Jun. 20, 2019

(51) Int. Cl.
*G11C 11/419* (2006.01)
*G11C 11/418* (2006.01)
*G11C 7/12* (2006.01)

(52) U.S. Cl.
CPC .......... *G11C 11/419* (2013.01); *G11C 7/12* (2013.01); *G11C 11/418* (2013.01)

(58) Field of Classification Search
CPC ..................... G11C 11/419; G11C 11/418
See application file for complete search history.

(56) References Cited

U.S. PATENT DOCUMENTS

| | | | | |
|---|---|---|---|---|
| 4,813,021 A * | 3/1989 | Kai | ........................ | G11C 5/063 365/194 |
| 4,969,125 A * | 11/1990 | Ciraula | .................. | G11C 5/005 365/203 |
| 5,774,410 A * | 6/1998 | Nakase | ................ | G11C 7/1051 365/230.05 |
| 5,848,015 A * | 12/1998 | Seno | ........................ | G11C 7/12 365/203 |
| 7,193,921 B2 * | 3/2007 | Choi | ........................ | G11C 7/20 365/194 |
| 9,563,573 B2 * | 2/2017 | Sobel | ........................ | G11C 7/12 |
| 9,886,988 B1 * | 2/2018 | Wang | ........................ | G11C 7/12 |
| 2002/0196240 A1 * | 12/2002 | Hajime | ................ | G09G 3/3648 345/204 |
| 2003/0112677 A1 * | 6/2003 | Lehmann | ............ | G11C 11/4094 365/203 |
| 2004/0160842 A1 * | 8/2004 | Fukiage | .................... | G11C 8/18 365/230.03 |
| 2004/0264275 A1 * | 12/2004 | Gou | ...................... | G11C 7/1072 365/203 |
| 2005/0082579 A1 * | 4/2005 | Horii | ...................... | G11C 16/26 257/222 |

(Continued)

Primary Examiner — Sung Il Cho (57) ABSTRACT

A processing system reduces by staging precharging of bitlines of a memory. In a static random access memory (SRAM) array, the voltage level on every bitline in the array is precharged to a reference voltage (VDD) rail voltage before a memory access. To facilitate reduction of current spikes from precharging, a precharge control unit groups entries of a RAM into a plurality of subsets, or regions, and applies a different precharge signal for precharging bitlines associated with each subset. Application of the precharge signals to the respective subsets over time results in smaller current spikes than simultaneous application of precharge signals to all of the bitlines.

20 Claims, 4 Drawing Sheets

(56) References Cited

U.S. PATENT DOCUMENTS

| | | | |
|---|---|---|---|
| 2007/0121400 A1* | 5/2007 | Lehmann | G11C 17/12 |
| | | | 365/203 |
| 2007/0201298 A1 | 8/2007 | Ramaraju | |
| 2007/0280030 A1 | 12/2007 | Ramaraju | |
| 2009/0268529 A1* | 10/2009 | Seo | G11C 11/4091 |
| | | | 365/189.07 |
| 2010/0202226 A1* | 8/2010 | Lee | G11C 8/12 |
| | | | 365/194 |
| 2011/0158021 A1* | 6/2011 | Wiatrowski | G11C 11/413 |
| | | | 365/203 |
| 2011/0299350 A1* | 12/2011 | Choi | G11C 7/12 |
| | | | 365/203 |
| 2015/0124543 A1* | 5/2015 | Lee | G11C 7/12 |
| | | | 365/202 |
| 2016/0036432 A1* | 2/2016 | Dhamdhere | G05F 1/595 |
| | | | 323/271 |
| 2016/0111142 A1* | 4/2016 | Yang | G11C 11/417 |
| | | | 365/154 |
| 2017/0316731 A1* | 11/2017 | Cho | G09G 3/2092 |

* cited by examiner

FIG. 4

STAGED BITLINE PRECHARGE

BACKGROUND

Description of the Related Art

A processing system typically employs random access memory (RAM) to store data used for processing operations. The memory has a plurality of entries (e.g., rows or lines), whereby each entry includes a set of bitcells to store the individual bits of the entry. In response to a read access request, the processing system can read data from an entry using a read operation having two phases: a precharge phase and an evaluate phase. During the precharge phase, the memory applies a charge to bitlines of the memory bitcells to a defined voltage representing an asserted logic level (e.g., a logic value of "1"). During the evaluate phase, the memory stops precharging the bitcells of the entry to be read, so that the bitlines connected to the bitcells are each set to a voltage level representing the data stored at their corresponding bit cell. However, current spikes during precharging can consume a relatively large amount of power and negatively impact the power efficiency of the processing system.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION OF EMBODIMENTS

FIGS. 1-4 illustrate techniques for reducing current spikes at a processing system by staging precharging of bitlines of a memory. In a static random access memory (SRAM) array, the voltage level on every bitline in the array is precharged to a reference voltage (VDD) rail voltage before a memory access. However, precharging all of the bitlines simultaneously results in a large current spike and a subsequent drop in the local power grid voltage. As wire resistance increases and decoupling capacitance per area decreases, large current spikes become more difficult to ameliorate. To facilitate reduction of current spikes from precharging, a precharge control unit groups entries of a RAM into a plurality of subsets, or regions, and applies a different precharge signal for precharging bitlines associated with each subset. Application of the precharge signals to the respective subsets over time results in smaller current spikes than simultaneous application of precharge signals to all of the bitlines. A current measurement module analyzes a current spike associated with precharging each subset of bitlines, and the precharge control unit modulates delays between precharge signals applied to each subset of bitlines based on the current measurement module analysis, so that the current spikes remain below a threshold and so that overlap between the current spikes is minimized.

Figure 1:
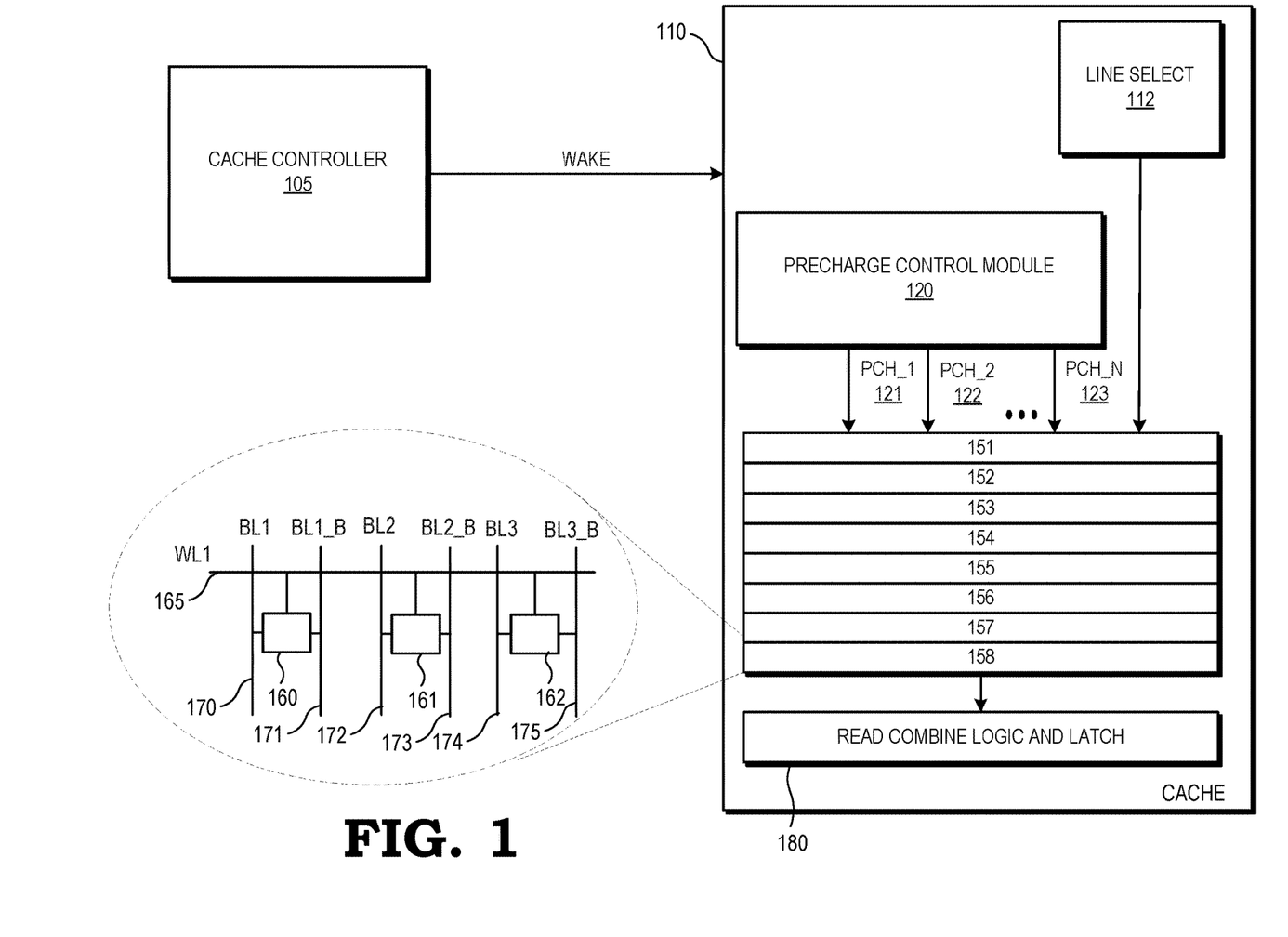
FIG. 1 is a block diagram of a processing system in accordance with some embodiments.

FIG. 1 illustrates a block diagram of a processing system 100 in accordance with some embodiments. In some embodiments, the processing system 100 is a part of one of a desktop computer, laptop, server, computing-enabled phone, game console, set-top box, or any other device that employs a processor to execute sets of instructions. In particular, the processing system 100 includes one or more processor cores (not shown) that together execute sets of instructions (e.g., computer programs) in order to carry out operations defined by the instruction sets. To facilitate completion of the operations, the processing system 100 includes memory devices, including the illustrated cache 110, that store data to be used by the executing sets of instructions.

In the course of executing particular instructions, referred to as memory access instructions, the processing system 100 generates memory access operations to store or retrieve data from the memory devices. For example, in response to executing a read instruction, the processing system 100 generates a read operation to retrieve data from the memory devices. In response to executing a write instruction, the processing system 100 generates a write operation to store data at the memory devices. The read and write operations generated by the processing system 100 are collectively referred to as "memory access operations."

Each memory access operation targets a particular location associated with the memory devices, wherein the location is identified by a memory address. In some embodiments, a memory address is associated with entries at different memory devices that store the same data. For example, in some embodiments the memory devices are arranged in a memory hierarchy, wherein the cache 110 is located at the highest level of the memory hierarchy and other memory devices (e.g., one or more lower level caches, system random access memory (RAM), disk drives, and the like) are located at lower levels of the memory hierarchy. A given memory address identifies an entry at each level of the memory hierarchy that stores data corresponding to the memory address.

The processing system 100 includes a cache controller 105 configured to decode address information for read operations. For each read operation, the cache controller 105 receives the corresponding base address and offset and performs an addition of these memory address components to identify a memory address. The cache controller 105 decodes the memory address to identify the particular one of the entries 151-158 that is the read entry. In some embodiments, the cache controller 105 identifies the memory address by generating two or more values, referred to herein as "memory address components". For example, in some embodiments the memory address components identified by the cache controller 105 include a base address value and an offset value, wherein the memory address for the memory access operation is the sum of the base address value and the offset value. As described further herein, in response to a memory access operation, the cache controller 105 combines the memory address components to identify the memory address. This combining of the memory address components and generating the signaling that identifies a particular memory entry is referred to herein as "decoding" the memory address. For example, if the memory address components are a base address value and an offset value, the cache controller 105 decodes the memory address by adding the base address value and the offset value.

The cache 110 includes multiple entries, also referred to as cache lines, such as entries 151-158. Each of the entries 151-158 includes a set of bitcells connected to corresponding bitlines and a corresponding wordline. For example, entry 158 includes bitcells 160-162 connected to wordline 165. Bitcell 160 is connected to differential bitlines 170 and 171, bitcell 161 is connected to differential bitlines 172 and 173, and bitcell 162 is connected to differential bitlines 174 and 175. To facilitate access to the entries 151-158, the cache 110 includes a precharge control module 120 and a line select module 112. For a read operation, the cache 110 implements two phases: a precharge phase and an evaluate phase.

During the precharge phase, a wake signal to the precharge control module 120 begins the precharge process of the bitlines for a set of entries including the entry corresponding to the decoded memory address of the read operation (i.e., to bitlines of an affected region). The precharge control module 120 allows the bitlines of the affected region to begin precharging at least one cycle earlier than when the bitlines of the affected region will be accessed. The precharge control module 120 then asserts control signaling PCH_1 121 to precharge a first subset of the bitlines for the entries 151-158. After a first delay after the assertion of control signaling PCH_1, the precharge control module 120 asserts control signaling PCH_2 122 to precharge a second subset of the bitlines for the entries 151-158. The precharge control module 120 continues asserting control signaling with delays for each subset of bitlines of the affected region through the assertion of control signaling PCH_N 123 to precharge an Nth subset of the bitlines for the entries 151-158. Each of the N assertions of control signaling brings the corresponding subset of bitlines to a defined voltage.

During the evaluate phase, the precharge control module 120 sends control signaling to discontinue precharging at the bitlines for the set of entries including the entry corresponding to the decoded memory address of the read operation. In addition, the line select module 112 identifies the entry corresponding to the decoded memory address and asserts a signal at the wordline for the identified entry. In response, the bitlines of the identified entry are each set to states corresponding to the data stored at the corresponding bit line. For example, if the bitcell 160 stores an asserted logic value (e.g., a logic value of "1") the bitline 170 remains at the precharged level while the bitline 171 is pulled to a voltage representing a negated logic value. Read combine logic and latch 180 logically combines the bitlines of different ones of the entries 151-158 to identify the values stored at each of the bitcells in the read entry, and latches the resulting read data for subsequent access by the processor.

In some embodiments, the bitcells of a precharge subset share corresponding bitlines. For example, in some embodiments a precharge subset includes entries 156, 157, and 158. Accordingly, in this example, bitlines 170 and 171 are connected to bitcell 160 for entry 158, another bitcell (not shown) for entry 157, and still another bitcell (not shown) for entry 156. Similarly, bitlines 172 and 173 are connected to bitcell 161 for entry 158, another bitcell (not shown) for entry 157, and still another bitcell (not shown) for entry 156. Thus, each bitline of the precharge subset is connected to a corresponding bitcell for each of the entries 156-158. Each of the entries 156-158 is connected to a different wordline, allowing the entries to be read individually.

To facilitate limiting the magnitude of a current spike associated with precharging the bitlines, the precharge control 120 groups entries 151-158 into multiple subsets, or regions. For example, in some embodiments, entries 151-153 are in one precharge subset, entries 154-156 are in a different precharge subset, and entries 157 and 158 are in still another precharge subset. In some embodiments, the entries 151-158 of the cache 110 are divided into banks, and each bank includes a plurality of columns of entries. In some embodiments, a first subset includes alternating columns of entries of a bank (e.g., odd-numbered columns), and a second subset includes the remaining columns of entries of the bank (e.g., even-numbered columns). In some embodiments, each subset includes a single column, such that the number of subsets equals the number of columns. Grouping the entries into different precharge subsets allows the precharge control 120 to apply a different precharge control signal to each of the plurality of precharge subsets. The different precharge control signals PCH_1 121, PCH_2 122, through PCH_N 123, each initiate precharging of the respective precharge subsets as a different time, such that the current spikes from precharging each subset of bitlines are maintained below a threshold.

In operation, the precharge control module 120 receives a wake signal from the cache controller 105 to allow the bitlines of the affected region to begin precharging at least one cycle earlier than when the bitlines of the affected region will be accessed. The precharge control module 120 then asserts control signaling PCH_1 121 to precharge a first subset of the bitlines for the entries 151-158. After a first delay after the assertion of control signaling PCH_1, the precharge control module 120 asserts control signaling PCH_2 122 to precharge a second subset of the bitlines for the entries 151-158. The precharge control module 120 continues asserting control signaling with delays for each subset of bitlines of the affected region through the assertion of control signaling PCH_N 123 to precharge an Nth subset of the bitlines for the entries 151-158. Each of the N assertions of control signaling brings the corresponding subset of bitlines to a defined voltage. By dividing the bitlines of the affected region into N subsets and applying separate precharge control signaling to each subset with a delay between the application of each precharge control signaling to each subset, the precharge control module 120 reduces the magnitudes of the current spikes resulting from precharging.

Figure 2:
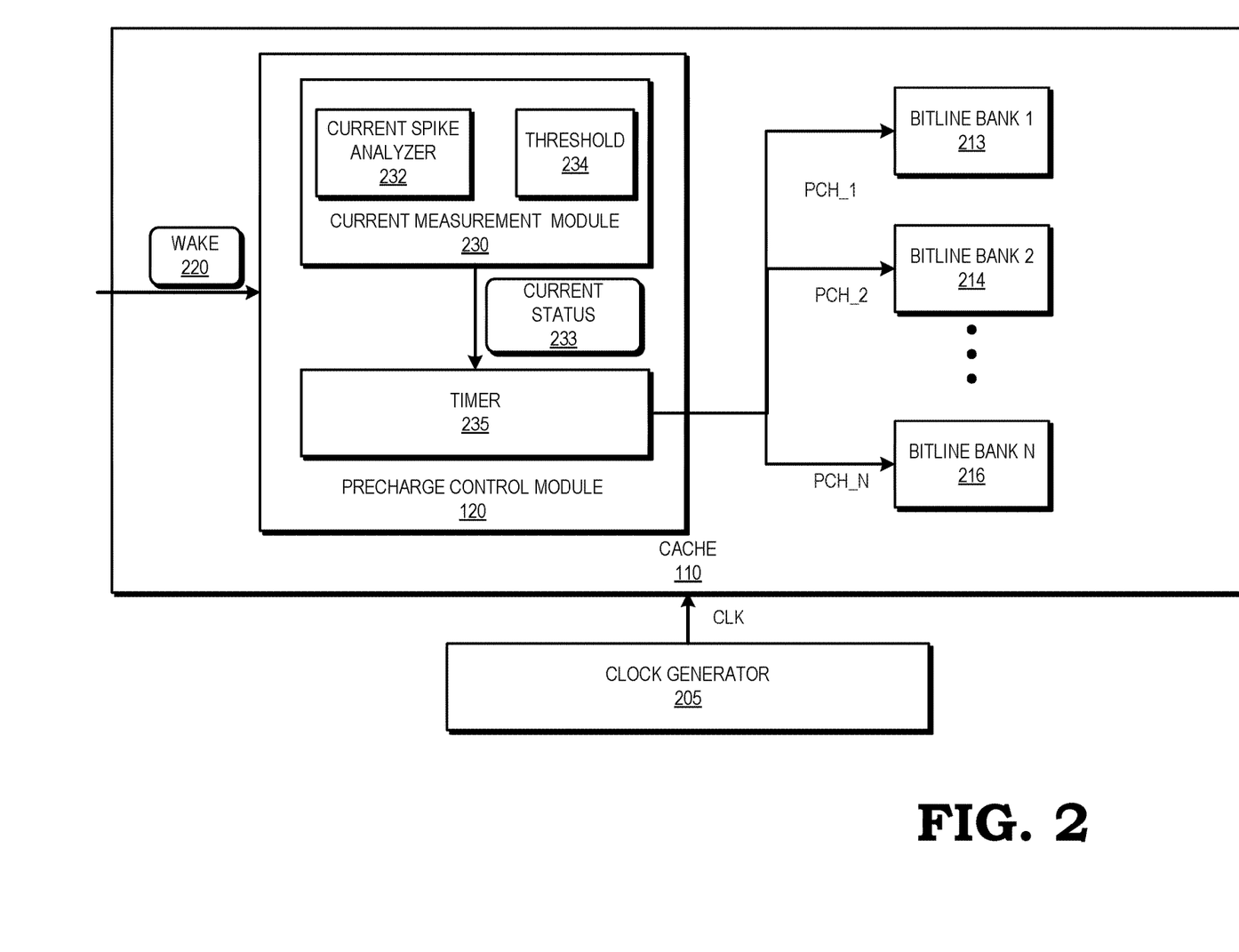
FIG. 2 is a block diagram of a precharge control of a cache of the processing system of FIG. 1 in accordance with some embodiments.

FIG. 2 illustrates a block diagram of the precharge control module 120 of the cache 110 of the processing system 100 of FIG. 1 in accordance with some embodiments. The cache 110 includes the precharge control module 120 and a plurality of bitlines divided into regions, or banks, 1-N (e.g., bitline bank 1 213, bitline bank 2 214, through bitline bank N 216). The cache 110 receives a clock signal CLK from a clock generator 205.

The clock generator 205 is a module configured to generate the CLK signal based on a timing signal (not shown) that is phase locked to a stable oscillating signal provided by a clock source (not shown), such as a reference crystal. In some embodiments, the clock generator 205 generates the CLK signal by selectively combining multiple clock signals based on control signaling that establishes the clock frequency for the CLK signal.

The precharge control module 120 is configured to receive a wake signal 220 from the cache controller 105 (not shown) in response to which the precharge control module 120 asserts a series of precharge control signaling for each subset of bitlines for a set of entries including the entry corresponding to the decoded memory address of the read operation. The wake signal 220 allows the bitlines of the affected region to begin precharging a cycle earlier than when the bitlines of the affected region will be accessed. The precharge control module 120 includes a timer 235 and, in the example illustrated in FIG. 2, the precharge control module 120 further includes a current measurement module 230. The current measurement module 230 includes a current spike analyzer 232 and a threshold 234. The current spike analyzer 232 is configured to analyze simulations and/or data indicating a magnitude and duration of current spikes resulting from precharging each of bitline bank 1 213, bitline bank 2 214, through bitline bank N 216. The current measurement module 230 compares the magnitudes and durations of the current spikes to the threshold 234. If the magnitudes and/or durations of the current spikes exceed the threshold 234, the current measurement module 230 provides a current status flag 233 to the timer 235 indicating that one or more of the current spikes exceeds the threshold 234. In some embodiments, the current measurement module 230 is incorporated in a circuit simulator (not shown) that analyzes simulations of current spikes on the basis of which the timer 235 controls precharge control signaling.

The timer 235 is configured to control the timing of assertion of precharge control signaling PCH_1 to bitline bank 1 213, assertion of PCH_2 to bitline bank 2 214, through assertion of PCH_N to bitline bank N 216. The timer 235 asserts precharge control signaling PCH_1 at a first time. After a first delay, the timer 235 asserts precharge control signaling PCH_2 at a second time. After a second delay, the timer 235 asserts the next precharge control signaling to the next bitline bank, until, after an N−1th delay, the timer 235 asserts precharge control signaling PCH_N. If the timer 235 receives a current status flag 233 indicating that that the current (e.g., due to one or more current spikes resulting from precharging) exceeds the threshold 234, the timer 235 adjusts one or more of the delays between the precharge control signals until the current measurement module 230 ceases providing the current status flag 233. In this way, the timer 235 stages precharging of the bitline banks 1-N 213-216 so that the current spikes remain below the threshold 234.

Figure 3:
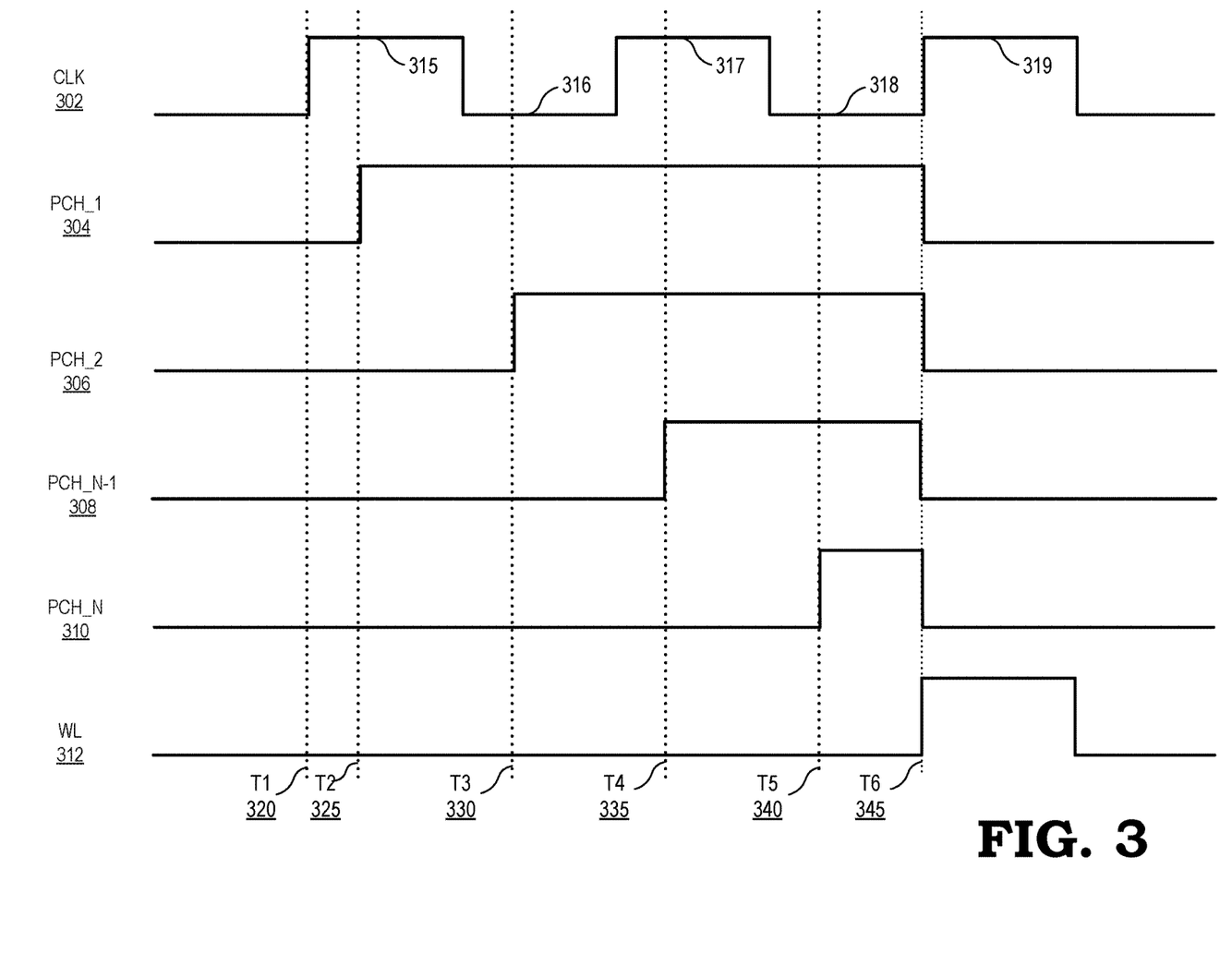
FIG. 3 is a diagram illustrating an example of the precharge control applying staged clock signals for precharging subsets of bitlines of the cache of FIG. 2 in accordance with some embodiments.

FIG. 3 is a diagram illustrating an example of the precharge control module 120 applying staged clock signals for precharging subsets, or regions, of bitlines of the cache 110 of FIG. 2 in accordance with some embodiments. FIG. 3 illustrates waveforms 302, 304, 306, 308, 310, and 312, corresponding to examples of the CLK, PCH_1, PCH_2, PCH_N−1, PCH_N, and WL signals, respectively. At a time T1 320, the CLK signal 302 from the clock generator 205 is high, coinciding with a wake signal (not shown). During clock phase 315, while the CLK signal 302 is still high, at a time T2 325, delayed from time T1 320, the timer 235 of the precharge control module 120 of FIG. 2 asserts precharge control signaling PCH_1 304 to the bitlines of bitline bank 1 213. At a time T3 330, delayed from time T2 325, and during clock phase 316, while the CLK signal 302 is low, the timer 235 asserts precharge control signaling PCH_2 306 to the bitlines of bitline bank 2 214. At a time T4 335, delayed from time T3 330, and during clock phase 317, while the CLK signal 302 is high, the timer 235 asserts precharge control signaling PCH_N−1 308 to the bitlines of bitline bank N−1 (not shown in FIG. 2). At a time T5 340, delayed from time T4 335, and during clock phase 318, while the CLK signal 302 is low, the timer 235 asserts precharge control signaling PCH_N 310 to the bitlines of bitline bank N 216.

At time T6 345, at the rising edge of clock phase 319 of the CLK signal 302, after all of the bitline banks 1-N 213-216 have been precharged, the precharge control module 120 sends control signaling to discontinue precharging at the bitlines for the set of entries including the entry corresponding to the decoded memory address of the read operation. In addition, the line select module 112 of FIG. 1 identifies the entry corresponding to the decoded memory address and asserts a signal WL 312 at the wordline for the identified entry.

Figure 4:
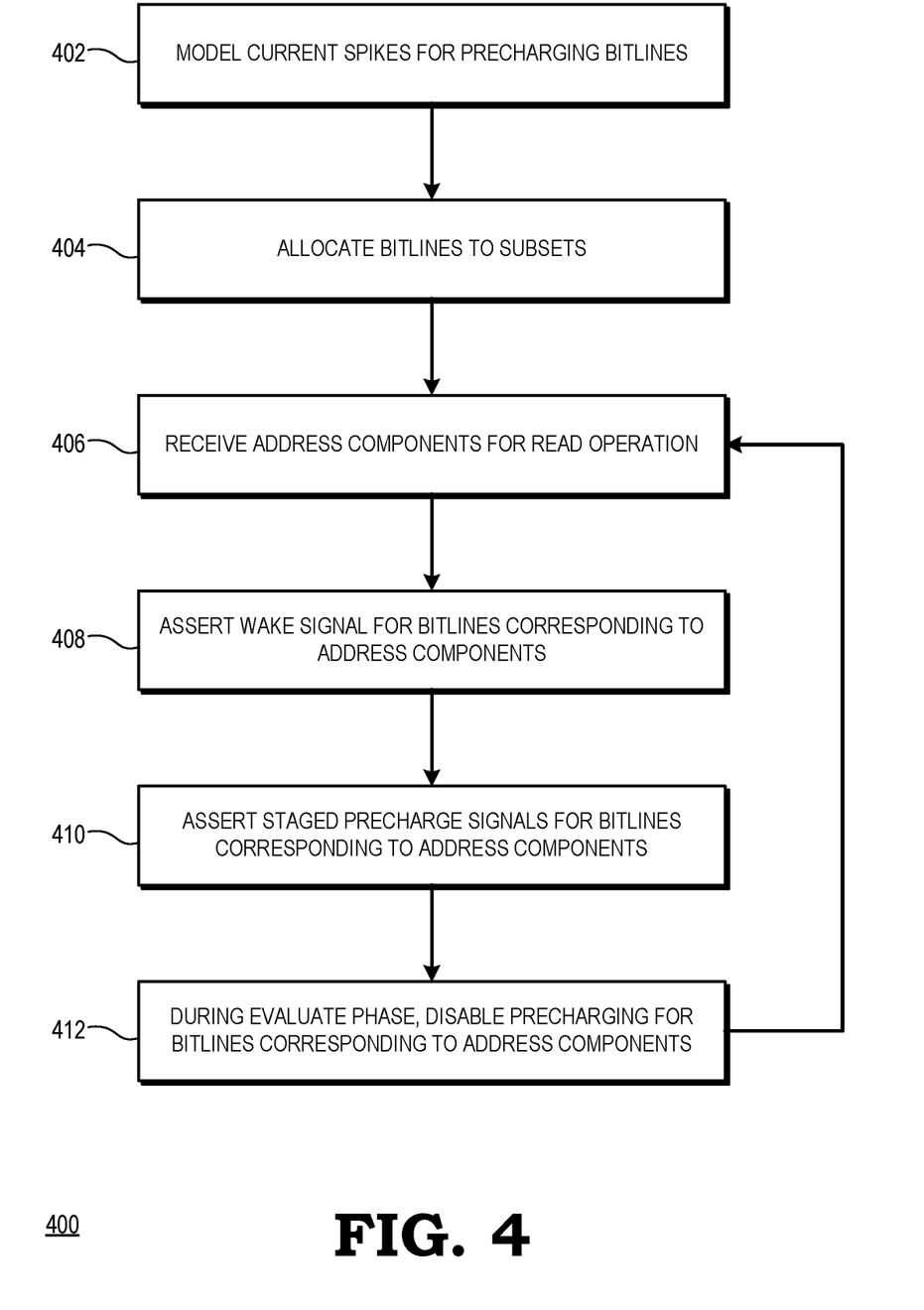
FIG. 4 is a flow diagram illustrating a method of staging precharging of subsets of bitlines in accordance with some embodiments.

FIG. 4 is a flow diagram illustrating a method 400 of staging precharging of subsets of bitlines in accordance with some embodiments. The method 400 is implemented in some embodiments of the precharge control module 120 shown in FIG. 2. At step 402, the current measurement module 230 models current spikes for precharging bitlines, based on analysis of simulations and/or measured data, to determine if any current spikes exceed the threshold 234. At step 404, the precharge control module 120 allocates bitlines to subsets, or regions. At step 406, the cache controller 105 receives address components for a read operation. At step 408, the cache controller 105 asserts a wake signal 220 to the precharge control module 120 for bitlines corresponding to the address components. At step 410, the precharge control module 120 asserts staged precharge control signaling to each subset of bitlines for bitlines corresponding to the address components. At step 412, during the evaluate phase, the precharge control module 120 disables precharging for bitlines corresponding to address components. The method flow then continues back to step 406 for the next read operation.

In some embodiments, the apparatus and techniques described above are implemented in a system including one or more integrated circuit (IC) devices (also referred to as integrated circuit packages or microchips), such as the multimedia system described above with reference to FIGS. 1-4. Electronic design automation (EDA) and computer aided design (CAD) software tools are used in the design and fabrication of these IC devices. These design tools typically are represented as one or more software programs. The one or more software programs include code executable by a computer system to manipulate the computer system to operate on code representative of circuitry of one or more IC devices to perform at least a portion of a process to design or adapt a manufacturing system to fabricate the circuitry. This code includes instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

A computer readable storage medium includes any non-transitory storage medium, or combination of non-transitory storage media, accessible by a computer system during use to provide instructions and/or data to the computer system. Such storage media include, but are not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium, in one embodiment, is embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

In some embodiments, certain aspects of the techniques described above may implemented by one or more processors of a processing system executing software. The software includes one or more sets of executable instructions stored or otherwise tangibly embodied on a non-transitory computer readable storage medium. The software includes the instructions and certain data that, when executed by the one or more processors, manipulate the one or more processors to perform one or more aspects of the techniques described above. The non-transitory computer readable storage medium includes, for example, a magnetic or optical disk storage device, solid state storage devices such as Flash memory, a cache, random access memory (RAM) or other non-volatile memory device or devices, and the like. The executable instructions stored on the non-transitory computer readable storage medium are implemented, for example, in source code, assembly language code, object code, or other instruction format that is interpreted or otherwise executable by one or more processors.

Note that not all the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above about specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method, comprising:
   precharging, in response to a first precharge control signal, differential bitlines for a first subset of a plurality of entries of a memory in response to a memory access to a memory address associated with the memory;
   precharging, in response to a second precharge control signal asserted independently from assertion of the first precharge control signal and delayed from the first precharge control signal by a first delay and during precharging of differential bitlines for the first subset, differential bitlines for a second subset of the plurality of entries of the memory, the second subset different from the first subset, in response to the memory access to the memory address associated with the memory;
   adjusting the first delay in response to an indication that a current spike resulting from precharging the first subset and the second subset exceeds a threshold; and
   ceasing adjusting the first delay when the indication ceases.

2. The method of claim 1, further comprising:
   precharging, in response to a third precharge control signal different from the first precharge control signal and the second precharge control signal and during precharging of the differential bitlines for the first subset and the second subset, differential bitlines for a third subset of the plurality of entries of the memory, the third subset different from the first subset and the second subset, in response to the memory access to the memory address associated with the memory.

3. The method of claim 1, wherein the first subset and the second subset comprise alternating columns within a bank of the plurality of entries of the memory.

4. The method of claim 1, further comprising discontinuing precharging of the first subset and the second subset.

5. The method of claim 1, wherein the first precharge control signal is delayed by a second delay from a clock signal associated with the memory and the second precharge control signal is delayed by a third delay from the clock signal associated with the memory.

6. The method of claim 5, wherein the second delay comprises a first phase of the clock signal associated with the memory and the third delay comprises a second phase of the clock signal associated with the memory.

7. The method of claim 5, wherein the third delay exceeds the second delay such that a current spike associated with precharging at the first precharge control signal does not overlap with a current spike associated with precharging at the second precharge control signal by more than a threshold amount.

8. A method, comprising:
   analyzing simulations or data indicating a magnitude or duration of current spikes resulting from precharging differential bitlines of a first subset of a plurality of entries of a memory in response to a first precharge control signal and precharging differential bitlines of a second subset of the plurality of entries of the memory in response to a second precharge control signal asserted independently from assertion of the first precharge control signal;
   adjusting an offset between the first precharge control signal and the second precharge control signal in response to an indication that a first current spike associated with precharging differential bitlines of the first subset overlaps with a second current spike associated with precharging differential bitlines of the second subset by more than a threshold amount; and
   ceasing adjusting the offset when the indication ceases.

9. The method of claim 8, further comprising:
   precharging differential bitlines of a third subset of the plurality of entries of the memory in response to a third precharge control signal; and
   adjusting an offset between the third precharge control signal and the second precharge control signal in response to an indication that a third current spike associated with precharging differential bitlines of the third subset overlaps with the second current spike associated with precharging differential bitlines of the second subset by less than the threshold amount.

10. The method of claim 8, wherein the first subset and the second subset comprise alternating columns of differential bitlines within a first bank of the plurality of entries of the memory.

11. The method of claim 8, further comprising discontinuing precharging of the first subset and the second subset.

12. The method of claim 8, wherein the first precharge control signal is delayed by a first delay from a clock signal associated with the memory and the second precharge control signal is delayed by a second delay from the clock signal associated with the memory.

13. The method of claim 12, wherein the first delay comprises a first phase of the clock signal associated with the memory and the second delay comprises a second phase of the clock signal associated with the memory.

14. A processing system, comprising:
a memory comprising a plurality of entries;
a control measurement module to analyze simulations or data indicating a magnitude or duration of current spikes resulting from precharging differential bitlines; and
a precharge control module to:
  precharge, at a first precharge control signal, differential bitlines for a first subset of the plurality of entries of the memory in response to a memory access to a memory address associated with the memory;
  precharge, at a second precharge control signal asserted independently from the first precharge control signal and during precharging of the first subset, differential bitlines for a second subset of the plurality of entries of the memory, the second subset different from the first subset, in response to the memory access to the memory address associated with the memory;
  adjust an offset between the first precharge control signal and the second precharge control signal in response to an indication from the control measurement module that a magnitude or duration of a current spike exceeds a threshold; and
  cease adjusting the offset when the indication ceases.

15. The processing system of claim 14, wherein the precharge control module is further to offset the second precharge control signal from the first precharge control signal such that a first current spike associated with precharging differential bitlines of the second subset overlaps with a first current spike associated with precharging differential bitlines of the first subset by less than a threshold amount.

16. The processing system of claim 14, wherein the precharge control module is further to precharge, at a third precharge control signal different from the first precharge control signal and the second precharge control signal and during precharging of the first subset and the second subset, differential bitlines for a third subset of the plurality of entries of the memory, the third subset different from the first subset and the second subset, in response to the memory access to the memory address associated with the memory.

17. The processing system of claim 14, wherein the first subset and the second subset comprise alternating columns within a bank of the plurality of entries of the memory.

18. The processing system of claim 14, wherein the precharge control module is further to discontinue precharging of the first subset and the second subset.

19. The processing system of claim 14, wherein the first precharge control signal is delayed by a first delay from a clock signal associated with the memory and the second precharge control signal is delayed by a second delay from the clock signal associated with the memory.

20. The processing system of claim 19, wherein the first delay comprises a first phase of the clock signal associated with the memory and the second delay comprises a second phase of the clock signal associated with the memory.

* * * * *